(12) United States Patent
Yoshida et al.

(10) Patent No.: US 8,030,213 B2
(45) Date of Patent: Oct. 4, 2011

(54) POLISHING COMPOUND FOR SEMICONDUCTOR INTEGRATED CIRCUIT DEVICE, POLISHING METHOD AND METHOD FOR PRODUCING SEMICONDUCTOR INTEGRATED CIRCUIT DEVICE

(75) Inventors: Iori Yoshida, Yokohama (JP); Yoshinori Kon, Yokohama (JP)

(73) Assignees: Asahi Glass Company, Limited, Tokyo (JP); AGC Seimi Chemical Co., Ltd., Chigasaki (JP)

( * ) Notice: Subject to any disclaimer, the term of this patent is extended or adjusted under 35 U.S.C. 154(b) by 585 days.

(21) Appl. No.: 11/856,166

(22) Filed: Sep. 17, 2007

(65) Prior Publication Data

US 2008/0070412 A1 Mar. 20, 2008

Related U.S. Application Data

(63) Continuation of application No. PCT/JP2006/303647, filed on Feb. 27, 2006.

(30) Foreign Application Priority Data

Mar. 16, 2005 (JP) .................................. 2005-074373

(51) Int. Cl.
*H01L 21/302* (2006.01)
*H01L 21/461* (2006.01)

(52) U.S. Cl. ........ 438/689; 438/690; 438/691; 438/692; 438/693

(58) Field of Classification Search .................. None
See application file for complete search history.

(56) References Cited

U.S. PATENT DOCUMENTS

| 6,312,486 | B1* | 11/2001 | Sandhu et al. ................. 51/307 |
| 7,311,855 | B2* | 12/2007 | Haga et al. .................. 252/79.1 |
| 7,695,345 | B2* | 4/2010 | Yoshida et al. ................. 451/36 |
| 2004/0132305 | A1* | 7/2004 | Nishimoto et al. ........... 438/690 |
| 2005/0005525 | A1* | 1/2005 | Li et al. ........................ 51/298 |
| 2005/0159085 | A1* | 7/2005 | Scott ............................. 451/41 |
| 2006/0197054 | A1* | 9/2006 | Akahori et al. ............. 252/79.1 |

FOREIGN PATENT DOCUMENTS

| EP | 1 416 025 A1 | 5/2004 |
| JP | 11-12561 | 1/1999 |
| JP | 2001-35818 | 2/2001 |
| JP | 2002-305167 | 10/2002 |
| JP | 3457144 | 8/2003 |
| JP | 2004/22804 | 1/2004 |

OTHER PUBLICATIONS

U.S. Appl. No. 11/951,540, filed Dec. 6, 2007, Kon, et al.
U.S. Appl. No. 11/863,852, filed Sep. 28, 2007, Yoshida, et al.
U.S. Appl. No. 12/401,747, filed Mar. 11, 2009, Kon, et al.
U.S. Appl. No. 12/403,864, filed Mar. 13, 2009, Kon, et al.
U.S. Appl. No. 12/618,018, filed Nov. 13, 2009, Kon, et al.

* cited by examiner

*Primary Examiner* — Duy Deo
(74) *Attorney, Agent, or Firm* — Oblon, Spivak, McClelland, Maier & Neustadt, L.L.P.

(57) ABSTRACT

To provide a polishing technique with which in production of a semiconductor integrated circuit device, when a plane to be polished is polished, an appropriate polishing rate ratio of a polysilicon film to another material can be obtained, whereby high level planarization of a plane to be polished including a polysilicon film can be realized.
A polishing compound for chemical mechanical polishing, containing cerium oxide particles, a water-soluble polyamine and water and having a pH within a range of from 10 to 13, is used.

21 Claims, 5 Drawing Sheets

BEFORE POLISHING

AFTER POLISHING

BEFORE POLISHING

AFTER POLISHING

POLISHING COMPOUND FOR SEMICONDUCTOR INTEGRATED CIRCUIT DEVICE, POLISHING METHOD AND METHOD FOR PRODUCING SEMICONDUCTOR INTEGRATED CIRCUIT DEVICE

TECHNICAL FIELD

The present invention relates to a polishing technique to be utilized for production of a semiconductor integrated circuit device. More particularly, it relates to a polishing compound suitable for planarization of a plane to be polished including a polycrystalline silicon (hereinafter referred to as a polysilicon) used for a capacitor, a gate electrode, etc. in a step of forming multilayered wiring, and a technique for polishing a plane to be polished including a polysilicon film to be used in production of a semiconductor integrated circuit device.

BACKGROUND ART

In recent years, development of miniaturization technique to achieve miniaturization and high densification is required along with high integration and high functionality of a semiconductor integrated circuit device. Particularly, importance of a planarization technique by chemical mechanical polishing (hereinafter referred to as CMP) has been increasing.

For example, along with miniaturization and multilayered structures of wiring of a semiconductor integrated circuit device, unevenness on the surface of each layer in production steps tends to be significant. In order to prevent such problems that the unevenness exceeds the depth of focus of photolithography, whereby no sufficient resolution will be obtained, CMP is an essential technique. CMP is employed, specifically, for planarization of an interlevel dielectric (ILD) film, shallow trench isolation (STI), tungsten plug formation, formation of multilayered wiring comprising copper and a low dielectric film, etc. In such cases, a polysilicon film is used for a capacitor, a gate electrode, etc. in many cases, and CMP is employed also for planarization of a plane to be polished including the polysilicon film.

Heretofore, in production of a semiconductor integrated circuit device, when the plane to be polished including a polysilicon film is planarized, usually, a silicon dioxide film or a silicon nitride film as a stopper layer is formed as an underlayer of the polysilicon film to be polished, and the ratio of the polishing rate of the polysilicon film to the polishing rate of the silicon dioxide film or the silicon nitride film (hereinafter (polishing rate of A)/(polishing rate of B) will sometimes be referred to as a "polishing rate ratio of A to B") is adjusted to be high, so that the plane to be polished is planarized upon exposure of the stopper layer.

For planarization of the plane to be polished including a polysilicon film, a SS series polishing compound containing fumed silica, water and potassium hydroxide manufactured by Cabot Corporation, has been used. However, this polishing compound is used also for polishing a silicon dioxide film for planarization of ILD, and accordingly when it is used for planarization of a plane to be polished with the stopper layer being a silicon dioxide film, the polishing rate of the silicon dioxide film is high, whereby the polishing rate ratio of the polysilicon film to the silicon dioxide film tends to be low. Further, with this polishing compound, the polishing rate ratio of the polysilicon film to a silicon nitride film is also low, and use of this polishing compound for planarization of a plane to be polished including a polysilicon film with the stopper layer being a silicon nitride film, is problematic.

To solve the above problems, Patent Document 1 proposes a polishing composition comprising at least one type of abrasive particles selected from fumed silica and colloidal silica as a polishing compound and an amine as a basic compound, as a polishing composition suitable for planarization of a plane to be polished including a polysilicon film. The polishing composition disclosed in this Patent Document is considered to be a polishing compound suitable for planarization of a plane to be polished including a polysilicon film, since when a silicon dioxide film is used as the stopper layer, the polishing rate ratio of a polysilicon film to a silicon dioxide film is high. Further, with this polishing composition, the polishing rate ratio of a polysilicon film to a silicon nitride film is also high, and this polishing composition is considered to make it possible to planarize a plane to be polished with the stopper layer being a silicon nitride film.

However, a polishing compound having such properties is unsuitable for planarization of a plane to be polished including a polysilicon film to be used for a capacitor, a gate electrode, etc. in formation of multilayered wiring, wherein a silicon nitride film is used as the stopper layer, and a polysilicon film and a silicon dioxide film on the silicon nitride film are to be polished. Namely, since the polishing rate of the silicon dioxide film is low as compared with the polishing rate of the polysilicon film, removal of the silicon dioxide film by polishing before the polishing compound reaches the silicon nitride film as the stopper layer will not sufficiently be conducted. In such a layer structure, it is required that the polishing rate of a silicon dioxide film is sufficiently high so as to be equal to the polishing rate of the polysilicon film and that the polishing rate of the silicon nitride film is sufficiently small as compared with the polishing rate of the polysilicon film, but the polishing compound having the above properties can not meet such requirements.

Patent Document 1: Japanese Patent No. 3457144
Patent Document 2: JP-A-11-12561
Patent Document 3: JP-A-2001-35818

DISCLOSURE OF THE INVENTION

Object to be Accomplished by the Invention

The object of the present invention is to solve the above problems and to provide a polishing compound for chemical mechanical polishing to polish a plane to be polished in production of a semiconductor integrated circuit device, which is suitable for a case where the plane to be polished includes a plane to be polished of a polysilicon film.

Other objects and advantages of the present invention will be apparent from the following description.

Means to Accomplish the Object

The present invention provides the following.

(1) A polishing compound for chemical mechanical polishing, to polish a plane to be polished in production of a semiconductor integrated circuit device, wherein the plane to be polished includes a plane to be polished of a polysilicon film, the polishing compound contains cerium oxide particles, a water-soluble polyamine and water, and the polishing compound has a pH within a range of from 10 to 13.

(2) The polishing compound according to the above (1), wherein the semiconductor integrated circuit device has a silicon dioxide film or a silicon nitride film directly beneath the polysilicon film.

(3) The polishing compound according to the above (1), wherein the semiconductor integrated circuit device has a silicon dioxide film directly beneath the polysilicon film, and has a silicon nitride film directly beneath the silicon dioxide film.

(4) The polishing compound according to any one of the above (1) to (3), wherein the water-soluble polyamine is at least one polymer selected from the group consisting of a water-soluble polyether polyamine and a water-soluble polyalkylene polyamine.

(5) The polishing compound according to any one of the above (1) to (4), which contains at least one basic compound selected from the group consisting of sodium hydroxide, potassium hydroxide, lithium hydroxide, tetramethylammonium hydroxide, monoethanolamine, ethylethanolamine, diethanolamine, propylenediamine and ammonia.

(6) The polishing compound according to the above (5), which contains the basic compound in an amount of from 0.001 to 5.0 mass % in the polishing compound.

(7) The polishing compound according to any one of the above (1) to (6), wherein the water-soluble polyamine has a weight average molecular weight of from 100 to 100,000.

(8) The polishing compound according to any one of the above (1) to (7), which contains the water-soluble polyamine in an amount of from 0.001 to 20 mass % based on the total mass of the polishing compound.

(9) A method for polishing a plane to be polished, which comprises supplying a polishing compound to a polishing pad, and bringing a plane to be polished of a semiconductor integrated circuit device and the polishing pad into contact with each other to polish the plane to be polished by relative movement between them, wherein the plane to be polished includes a plane to be polished of a polysilicon film, and the polishing compound as defined in any one of the above (1) to (8) is used as the polishing compound.

(10) A method for producing a semiconductor integrated circuit device, which comprises a step of polishing a plane to be polished by the polishing method as defined in the above (9).

EFFECTS OF THE INVENTION

According to the present invention, when a plane to be polished is polished in production of a semiconductor integrated circuit device, an appropriate polishing rate ratio of a polysilicon film to the other materials will be achieved, whereby high level planarization of the plane to be polished can be realized.

MEANINGS OF SYMBOLS

Figure 1A:
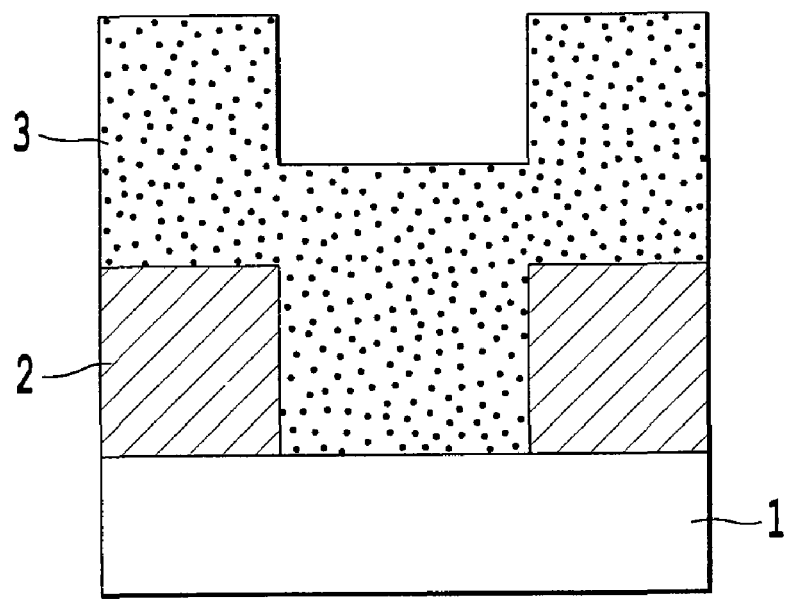
FIG. 1 is cross-sections schematically illustrating polishing of a semiconductor device substrate by the polishing compound of the present invention in a step of planarizing a plane to be polished including a polysilicon film.

1: Silicon substrate, 2: silicon dioxide film, 3: polysilicon film, 4: silicon nitride film, 5: polished plane, 31: semiconductor device, 32: polishing head, 33: polishing platen, 34: polishing pad, 35: polishing compound supply piping, 36: polishing compound

BEST MODE FOR CARRYING OUT THE INVENTION

Now, embodiments of the present invention will be described with reference to drawings, Tables, formulas, Examples, etc. These drawings, Tables, formulas, Examples, etc. and description are to exemplify the present invention, and the present invention is not limited thereto. The present invention includes other embodiments within a range not to exceed the scope of the present invention. In the drawings, the same symbol designates the same constituent.

The polishing compound of the present invention is a polishing compound for chemical mechanical polishing to polish a plane to be polished of a semiconductor integrated circuit device (hereinafter sometimes referred to simply as a semiconductor device), and contains cerium oxide particles, a water-soluble polyamine and water and has a pH within a range of from 10 to 13. It may further contain a dispersant.

By use of this polishing compound, when a plane to be polished of a semiconductor device includes a plane to be polished of a polysilicon film, it is easy to control the polishing rate ratio of the polysilicon film to other materials. Accordingly, in production of a semiconductor device, a flat plane to be polished can easily be formed upon exposure of a layer made of another material after the plane to be polished of the polysilicon film is polished. This polysilicon film may be contained at two or more portions in one semiconductor device. In the present invention, the "plane to be polished" means a surface at an intermediate stage which appears in the process of producing a semiconductor device.

The polishing compound of the present invention is useful when a semiconductor device has a silicon dioxide film or a silicon nitride film immediately beneath a polysilicon film. Such a structure is commonly employed when a silicon dioxide film or a silicon nitride film is used as a stopper film.

Further, the polishing compound of the present invention is useful also when a semiconductor device has a silicon dioxide film immediately beneath the polysilicon film and has a silicon nitride film immediately beneath the silicon dioxide film. Such a structure is commonly employed when a silicon nitride film is used as a stopper film and a silicon dioxide film and a polysilicon film are formed on the silicon nitride film.

Figure 1B:
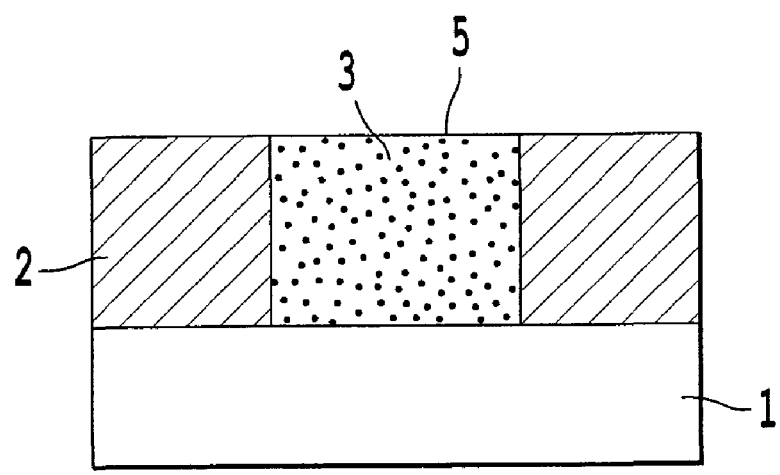

These structures are shown in FIGS. 1, 4 and 5. FIGS. 1, 4 and 5 are cross-sections schematically illustrating a semiconductor device comprising a substrate 1, and a silicon dioxide film 2, a polysilicon film 3 and a silicon nitride film 4 laminated on the substrate.

In FIG. 1, in a case where a semiconductor device has a silicon dioxide film 2 as a stopper layer as shown in FIG. 1(a), it is possible to planarize unevenness on a polished plane 5 at a high level upon exposure of the silicon dioxide film 2 with the polishing compound of the present invention by making the ratio of the polishing rate (Vps) of the polysilicon film 3 to the polishing rate (Vso) of the silicon dioxide film 2 (i.e. the polishing rate ratio Vps/Vso) high.

Figure 4A:
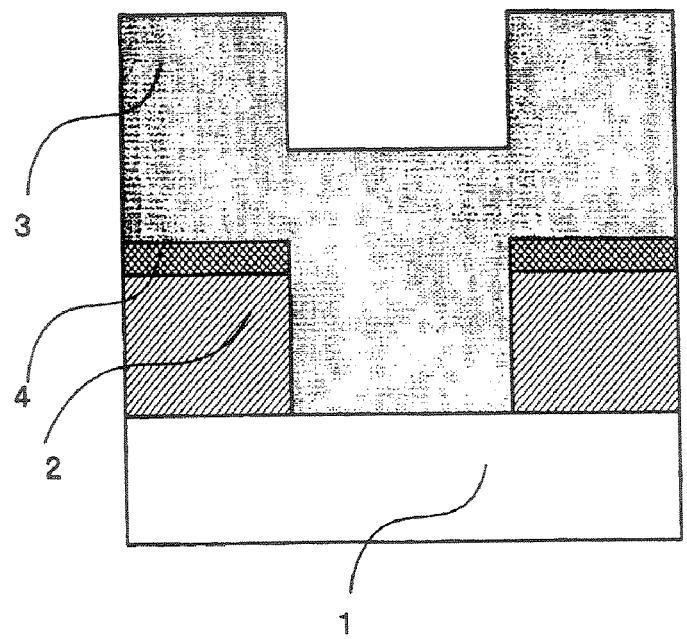
FIG. 4 is cross-sections schematically illustrating polishing of a semiconductor device substrate by the polishing compound of the present invention in a step of planarizing a plane to be polished including a polysilicon film.
Figure 4B:
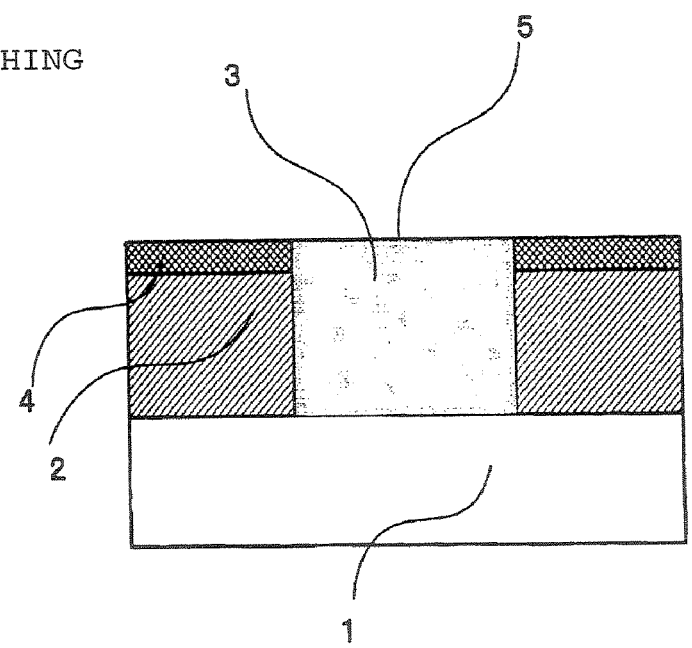

In a case where a silicon nitride film 4 is employed as a stopper layer as shown in FIG. 4(a), it is possible to planarize unevenness on a polished plane at a high level 5 upon exposure of the silicon nitride film 4 as shown in FIG. 4(b) with the polishing compound of the present invention by making the ratio of the polishing rate (Vps) of the polysilicon film 3 to the polishing rate (Vsn) of the silicon nitride film 4 (i.e. the polishing rate ratio Vps/Vsn) high.

Figure 5A:
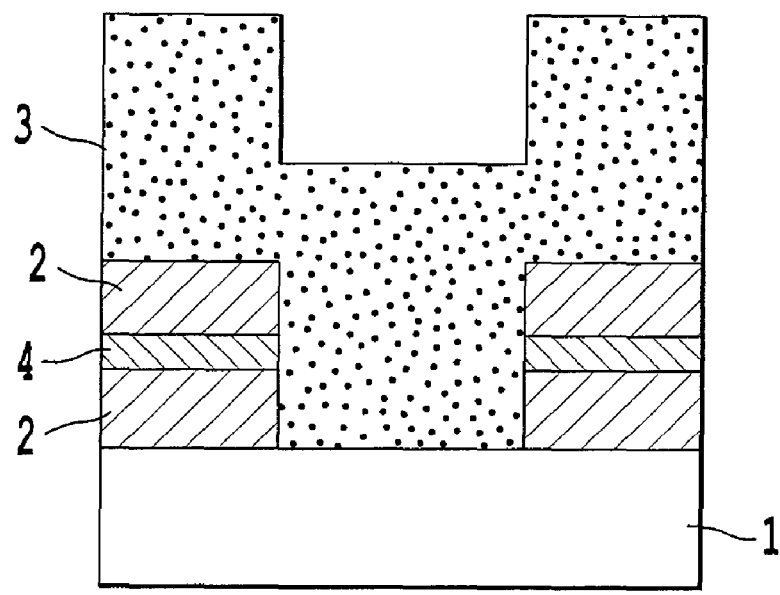
FIG. 5 is cross-sections schematically illustrating polishing of a semiconductor device substrate by the polishing compound of the present invention in a step of planarizing a plane to be polished including a polysilicon film.
Figure 5B:
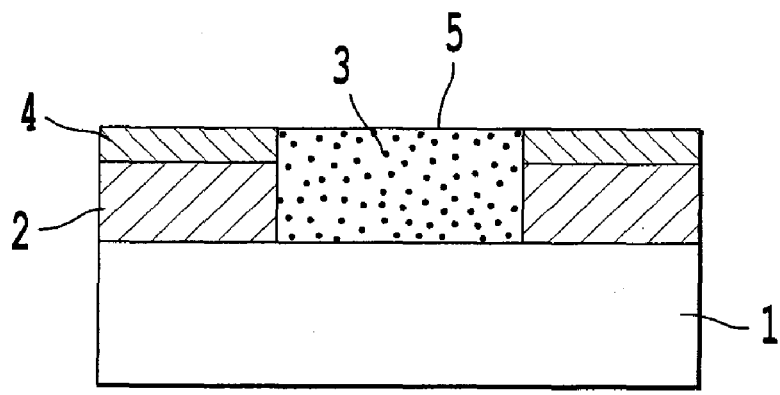

Further, in a case where the silicon nitride film 4 as the stopper layer is in the interior of the silicon dioxide film 2 as shown in FIG. 5(a), it is possible to planarize unevenness on a polished plane 5 as shown in FIG. 5(b) at a high level with the polishing compound of the present invention by maintaining the polishing rate ratio Vps/Vsn high and adjusting the polishing rates Vps and Vso be at the same level.

Further, the present polishing compound is free from agglomeration of abrasive particles and is thereby excellent in dispersion stability and is advantageous against polishing defects.

In the present invention, cerium oxide is used as the abrasive particles in the polishing compound. In alkaline conditions, negatively charged silanol groups are formed on the surface of a polysilicon film by the presence of an amine substance, and accordingly polishing effect by chemical reaction will increase by use of cerium oxide abrasive particles instead of silica abrasive particles which have been used as abrasive particles for polishing. Accordingly, the present polishing compound provides a high polishing rate of a polysilicon film similar to a silicon dioxide film. As the cerium oxide abrasive particles in the present invention, for example, cerium oxide abrasive particles as disclosed in Patent Document 2 or 3 can be preferably used. That is, a cerium oxide powder obtained by adding an alkali to a cerium (IV) ammonium nitrate aqueous solution to prepare a cerium hydroxide gel, followed by filtration, washing and firing, can be preferably used. Further, cerium oxide abrasive particles obtained by milling high purity cerium carbonate and firing it, followed by milling and classification, may also be preferably used. However, the cerium oxide abrasive particles are not particularly limited thereto.

The average particle size (diameter) of the cerium oxide abrasive particles is preferably from 0.01 to 0.5 μm, particularly preferably from 0.02 to 0.3 μm, more preferably from 0.05 to 0.2 μm, in view of polishing properties and dispersion stability. If the average particle size is too large, polishing defects such as scratches are likely to form on the surface of the semiconductor substrate. If the average particle size is too small, the polishing rate may be too low. Further, since the ratio of the surface area per unit volume is high, the cerium oxide abrasive particles are likely to be influenced by the surface state. Depending on conditions such as the pH and the concentration of additives, the abrasive particles are likely to agglomerate in some cases. If agglomeration takes place, polishing defects such as scratches are likely to form on the surface of the semiconductor substrate.

The water-soluble polyamine in the polishing compound is not limited so long as it is a water-soluble compound having at least two amino groups in one molecule. Water-solubility may be of any degree so long as the water-soluble polyamine is completely dissolved in a polishing compound liquid at a concentration at which the liquid is used as a polishing compound. Usually, water-solubility means that at least 1 mass %, preferably at least 5 mass % of the water-soluble polyamine is dissolved in pure water. Specifically, preferred is at least one material selected from the group consisting of water-soluble polyether polyamine, water-soluble polyalkylene polyamine, polyethyleneimine, water-soluble polyvinylamine, water-soluble polyallylamine, water-soluble polylysine and water-soluble chitosan. A particularly preferred water-soluble polyamine is a water-soluble polyether polyamine or a water-soluble polyalkylene polyamine.

The molecular weight of the water-soluble polyamine is not particularly limited so long as the polyamine is water-soluble, but it is preferably from 100 to 100,000, more preferably from 100 to 2,000, by the weight average molecular weight. If the weight average molecular weight is less than 100, the effect of the water-soluble polyamine tends to be small. If it exceeds 100,000, even though the polyamine is water-soluble, it may adversely affect properties of the polishing compound such as fluidity. If the weight average molecular weight exceeds 2,000, solubility in pure water decreases in many cases. A particularly preferred water-soluble polyamine is a water-soluble polyether polyamine or a water-soluble polyalkylene polyamine, having a weight average molecular weight of from 100 to 2,000.

Such a water-soluble polyamine is used to suppress the polishing rates of the silicon dioxide film and the silicon nitride film and to accelerate polishing of the polysilicon film. Further, by addition of a basic compound such as ammonia, the polishing rate (Vso) of the silicon dioxide film can be controlled while maintaining a high polishing rate ratio (Vps/Vsn) of the polysilicon film to the silicon nitride film. That is, a conventional polishing compound for a polysilicon film has such problems that the polishing rate ratio (Vps/Vsn) of the polysilicon film to the silicon nitride film is low, and that the polishing rate (Vso) of the silicon dioxide film can not be controlled while maintaining a high polishing rate ratio (Vps/Vsn) of the polysilicon film to the silicon nitride film, and these problems can be solved.

The reason why the polishing rates of the silicon dioxide film and the silicon nitride film are suppressed and polishing of the polysilicon film is accelerated by addition of a water-soluble polyamine, is considered to be an effect of adsorption of the water-soluble polyamine (such as polyoxypropylene diamine) on the cerium oxide abrasive particles and on the plane to be polished. It is considered that contact of cerium oxide with the silicon dioxide film or the silicon nitride film in the material to be polished will be inhibited by the above effect, whereby progress of polishing will be suppressed. Regarding the polysilicon film, it is considered that the polysilicon film will easily be abraded by the mechanical function of the polishing compound due to chemical changes by the water-soluble polyamine, whereby polishing is accelerated.

A particularly preferred water-soluble polyamine in the present invention is at least one water-soluble polyamine selected from the group consisting of a water-soluble polyether polyamine having a weight average molecular weight of from 100 to 2,000 and a water-soluble polyalkylene polyamine having a weight average molecular weight of from 100 to 2,000. From the viewpoint of high effect of stabilizing dispersion of the cerium oxide abrasive particles, the weight average molecular weight of the water-soluble polyether polyamine is more preferably from 150 to 800, furthermore preferably from 150 to 400.

The above polyether polyamine is a compound having at least two amino groups and at least two etheric oxygen atoms. The amino group is preferably a primary amino group (—$NH_2$). The polyether polyamine may have a secondary amino group (—NH—) or a tertiary amino group as amino groups, but the polyether polyamine in the present invention is preferably a compound having at least two primary amino groups and having substantially no other amino groups, particularly preferably a polyether diamine having two primary amino groups alone. The polyether polyamine is preferably a compound having such a structure that a hydrogen atom of a hydroxyl group in a polyhydric alcohol or a polyether polyol is substituted by an aminoalkyl group. The polyhydric alcohol is preferably a dihydric to hexahydric alcohol, particularly preferably a dihydric alcohol, and the polyether polyol is preferably a dihydric to hexahydric polyoxyalkylene polyol, particularly preferably a polyoxyalkylene diol. The aminoalkyl group is preferably a $C_{2-6}$ aminoalkyl group such as a 2-aminoethyl group, a 2-aminopropyl group, a 2-amino-1-methylethyl group, a 3-aminopropyl group, a 2-amino-1,1-dimethylethyl group or a 4-aminobutyl group.

The polyhydric alcohol is preferably a $C_{2-8}$ dihydric alcohol which may have an etheric oxygen atom, such as ethylene glycol, diethylene glycol, propylene glycol or dipropylene glycol. The polyether polyol is preferably a polyether diol of which the repeating unit is a $C_{2-6}$ oxyalkylene group, such as a polyethylene glycol (i.e. polyoxyethylene diol) such as triethylene glycol or tetraethylene glycol, a polypropylene glycol (i.e. polyoxypropylene diol) such as tripropylene glycol or tetrapropylene glycol, or a polyoxyalkylene diol having at least two types of oxyalkylene groups, such as poly(oxypropylene/oxyethylene) diol.

The polyalkylene polyamine is a compound having at least three amino groups bonded via an alkylene group. Preferably, the terminal amino group is a primary amino group and the amino group in the interior of the molecule is a secondary amino group. More preferred is a chain polyalkylene polyamine having a primary amino group at both molecular terminals and having at least one secondary amino group in the interior of the molecule. At least two bonding moieties consisting of an alkylene group, sandwiched between an amino group and another amino group, exist in one molecule, and such a plurality of bonding moieties between amino groups may be the same or different. Preferably, all these moieties are the same, or two bonding moieties between amino groups bonded to the primary amino group at both terminals are the same and the other bonding moiety between amino groups is different. One bonding moiety between amino groups preferably has from 2 to 8 carbon atoms, particularly preferably each of the two bonding moieties between amino groups bonded to the primary amino group at both terminals has from 2 to 8 carbon atoms and the other bonding moiety between amino groups has from 2 to 6 carbon atoms.

Each of the polyether diamine and the polyalkylene polyamine is preferably a compound having a structure of the following formula (1):

$$H_2N-(R-X-)_k-R-NH_2 \quad (1)$$

wherein R is a $C_{2-8}$ alkylene group, X is an oxygen atom or —NH—, and k is an integer of at least 2 in the case of a polyether diamine or an integer of at least 1 in the case of a polyalkylene polyamine, provided that a plurality of R's in one molecule may be different.

Particularly, the polyether diamine is preferably a compound having a structure of the following formula (2), and the polyalkylene polyamine is preferably a compound having a structure of the following formula (3):

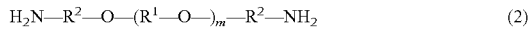

$$H_2N-R^2-O-(R^1-O-)_m-R^2-NH_2 \quad (2)$$

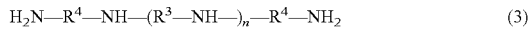

$$H_2N-R^4-NH-(R^3-NH-)_n-R^4-NH_2 \quad (3)$$

wherein $R^1$ is an ethylene group or a propylene group, $R^2$ is a $C_{2-6}$ alkylene group, $R^3$ is a $C_{2-6}$ alkylene group, $R^4$ is a $C_{2-8}$ alkylene group, m is an integer of at least 1, and n is an integer of at least 1, provided that $R^1$ and $R^2$ may be the same or different, and $R^3$ and $R^4$ may be the same or different.

Specifically, the polyether diamine of the formula (2) may, for example, be a polyoxypropylene diamine (a compound wherein $R^1$ and $R^2$ are propylene groups and m is at least 1), polyoxyethylene diamine (a compound wherein $R^1$ and $R^2$ are ethylene groups and m is at least 1), or 4,7,10-trioxatridecane-1,13-diamine (a compound wherein $R^1$ is an ethylene group, $R^2$ is a trimethylene group and m is 2). Specifically, the polyalkylene polyamine of the formula (3) may, for example, be tetraethylenepentamine (a compound wherein $R^3$ and $R^4$ are ethylene groups and n is 2), pentaethylenehexamine (a compound wherein $R^3$ and $R^4$ are ethylene groups and n is 3), heptaethyleneoctamine (a compound wherein $R^3$ and $R^4$ are ethylene groups and n is 5), N,N'-bis(3-aminopropyl)-ethylenediamine (a compound wherein $R^3$ is an ethylene group, $R^4$ is a trimethylene group and n is 1), or N,N'-bis(2-aminoethyl)-1,4-butanediamine (a compound wherein $R^3$ is a tetramethylene group, $R^4$ is an ethylene group and n is 1).

The concentration of the water-soluble polyamine in the polishing compound is preferably set properly within a range of from 0.001 to 20 mass %, considering the polishing rate, uniformity of a polishing compound slurry, the weight average molecular weight of the water-soluble polyamine, etc., with a view to obtaining sufficient effects of suppressing the polishing rate. The concentration of the water-soluble polyamine in the polishing compound is more preferably within a range of from 0.05 to 5 mass %.

The water in the present invention is not particularly limited, but preferred is pure water, ultrapure water, deionized water, etc. in view of influences over the other components, inclusion of impurities, influences on the pH, etc.

The present polishing compound can be used within an alkaline pH region. Considering the polishing properties and dispersion stability of the polishing compound, it is used preferably at a pH of from 10 to 13. If the pH is less than 10, the dispersibility may decrease, and if it exceeds 13, although the polishing properties will not be impaired, the plane to be polished may be affected, or handling properties may be impaired.

The polishing compound of the present invention preferably contains a basic compound. The polishing rate of the silicon dioxide film can be controlled by changing the type and the addition amount of the basic compound. By this effect, in a structure wherein a silicon nitride film is used as a stopper layer and a silicon dioxide film and a polysilicon film are provided on the silicon nitride film as shown in FIG. 5(a), the polysilicon film and the silicon dioxide film can be polished at about the same polishing rates. The polishing rate ratio (Vps/Vso) of the polysilicon film to the silicon dioxide film can be freely controlled by changing the type and the addition amount of the basic compound, and in the case of the above composition, it is useful to control Vps/Vso to from 0.5 to 1.5, particularly from 0.8 to 1.2.

The basic compound is not particularly limited. At least one basic compound selected from the group consisting sodium hydroxide, potassium hydroxide, lithium hydroxide, tetramethylammonium hydroxide, monoethanolamine, ethylethanolamine, diethanolamine, propylenediamine and ammonia may, for example, be preferably mentioned. Among them, ammonia is particularly preferred, with which the polishing rate can easily be controlled.

This basic compound is contained in the polishing compound in an amount of preferably from 0.001 to 5.0 mass %, more preferably from 0.005 to 2.0 mass %. If it is less than 0.001 mass %, the effect of controlling the polishing rate of the silicon dioxide film tends to be 5 small, and if it exceeds 5.0 mass %, no particular effect will be obtained.

In the polishing compound of the present invention, another component may coexist. As a typical example, a dispersant may be mentioned. The dispersant may be a water-soluble organic polymer or an anionic surfactant. The water-soluble organic polymer is preferably a polymer having a carboxylic acid group, a carboxylic acid ammonium salt or the like.

The polishing compound of the present invention is not necessarily subjected to polishing as a mixture of all the polishing materials constituting the polishing compound. The polishing materials may be mixed to have a composition of the polishing compound when subjected to polishing. For example, a liquid containing cerium oxide particles and water, and optionally a dispersant, and a liquid containing a water-soluble polyamine and a basic compound, are separately prepared and properly mixed at the time of polishing with the mixture ratio adjusted. Further, a liquid containing cerium oxide particles, a dispersant, a water-soluble polyamine and water, and a liquid containing a basic compound and water, may be prepared. The polishing materials may be divided in another way.

By adjusting the mixture ratio, for example, the polishing rate of the silicon dioxide film can be controlled while maintaining a high polishing rate ratio of the polysilicon film to the silicon nitride film, and such is a useful method when the polishing rate ratio should be optimized depending upon the structure of a semiconductor device. More specifically, with the present polishing compound, the polishing rate of the silicon nitride film is low and the polishing rate of the silicon dioxide film can be controlled, and accordingly it can be used effectively for shallow trench isolation, planarization of an ILD film, etc.

When a semiconductor substrate is polished by using is the polishing compound of the present invention, the polishing compound is supplied to a polishing pad, and a plane to be polished of a semiconductor device and the polishing pad are brought into contact with each other, so that the plane to be polished including a plane to be polished of a polysilicon film is polished by the relative movement between them. As already described above, by use of the polishing compound of the present invention, the polishing rate ratio of the polysilicon film to the silicon dioxide film and the polishing rate ratio of the polysilicon film to the silicon nitride film can be made high, and further, the polishing rate ratio of the polysilicon film to the silicon dioxide film can be controlled while maintaining a high polishing rate ratio of the polysilicon film to the silicon nitride film. Thus, the present polishing method can be suitably used particularly for a case where a semiconductor device has a silicon dioxide film or a silicon nitride film directly beneath a polysilicon film or a case where it has a silicon dioxide film directly beneath a polysilicon film and has a silicon nitride film directly beneath the silicon dioxide film.

Figure 2:
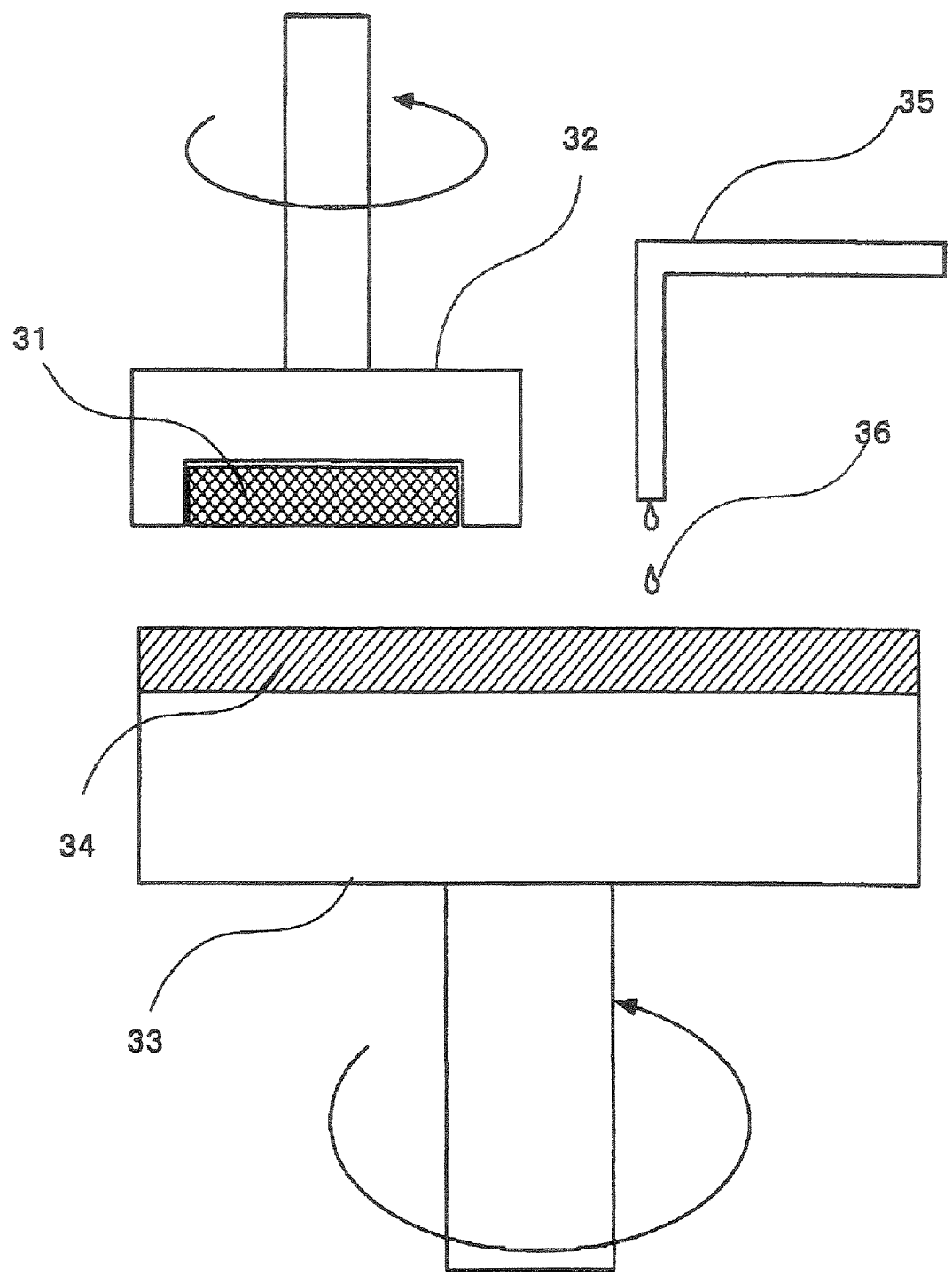
FIG. 2 is a view illustrating one example of a polishing apparatus applicable to the polishing method of the present invention.

As a polishing apparatus, a common polishing apparatus may be used. For example, FIG. 2 is a drawing illustrating one example of a polishing apparatus applicable to the polishing method of the present invention. It employs a method of holding a semiconductor device 31 in a polishing head 32 and bringing it into contact with a polishing pad 34 bonded to the surface of a polishing platen 33, and rotating the polishing head 32 and the polishing platen 33 to bring relative movement, while supplying a polishing compound 36 from a polishing compound supply piping 35. However, the polishing apparatus in the present invention is not limited thereto.

The polishing head 32 may not only rotate but also move linearly. The polishing platen 33 and the polishing pad 34 may have the same size as the semiconductor device 31 or smaller.

In such a case, preferably the polishing head 32 and the polishing platen 33 are relatively moved so that the entire surface of the semiconductor device can be polished. The polishing platen 33 and the polishing pad 34 may not be rotary type but may be of a belt type and move in one direction.

The polishing conditions of the polishing apparatus are not particularly limited, but the polishing rate can be improved by applying a load to the polishing head 32 and pressing the polishing head 32 against the polishing pad 34. The polishing pressure is preferably from about 0.5 to about 50 kPa, and it is particularly preferably from about 3 to about 40 kPa from the viewpoint of uniformity of the polishing rate in a semiconductor device, flatness, and prevention of polishing defects such as scratches. Further, the rotation speed of the polishing platen and the polishing head is preferably from about 50 to about 500 rpm, but is not limited thereto.

As the polishing pad, common one made of e.g. a non-woven fabric, a polyurethane foam, a porous resin or a non-porous resin can be used. Further, on the surface of the polishing pad, e.g. lattice, concentric or spiral grooves may be formed so as to accelerate supply of the polishing compound or to make a certain amount of the polishing compound stay.

In such a manner, according to the present invention, at the time of polishing a plane to be polished in production of a semiconductor device, an appropriate polishing rate ratio of a polysilicon film to other materials can be obtained. Accordingly, in production of a semiconductor device using the present polishing method, the cost can be reduced and the throughput can be improved.

EXAMPLES

Now, the present invention will be described in further detail with reference to Examples. Examples 1 to 6 are Examples of the present invention, and Examples 7 and 8 are Comparative Examples. In Examples, "%" means mass % unless otherwise specified. Properties were evaluated by the following methods.

(pH)

Measured by pH81-11 manufactured by Yokogawa Electric Corporation.

(Average Particle Size of Abrasive Particles)

Determined by a laser scattering/diffraction apparatus (tradename: LA-920, manufactured by Horiba, Ltd.)

(Stability of Dispersion of Polishing Compound)

The "coagulation sedimentation time" in Examples was determined as a time until 20 mL of a polishing compound put in a glass test tube with a diameter of 18 mm left at rest for ten days was separated into two layers to form a supernatant liquid.

(Polishing Properties)

(1) Polishing Conditions

Polishing was carried out by the following apparatus under the following conditions.

Polishing machine: Automatic CMP machine MIRPA (manufactured by Applied Materials, Inc.)

Polishing compound supply rate: 200 mL/minuite

Polishing pad: Two-layer pad IC-1400 K-Groove or single layer pad IC-1000 K-Groove (manufactured by Rodel, Inc.)

Polishing pad conditioning: MEC100-PH3.5L (manufactured by Mitsubishi Materials Corporation)

Speed of revolutions of polishing platen: 127 rpm (common to all Examples)

Speed of revolutions of polishing head: 123 rpm (common to all Examples)

Polishing pressure: 27.6 kPa (common to all Examples)

(2) Object to be Polished

The following objects to be polished were used. As objects to be polished by polishing compounds in Examples 1 to 4, 7 and 8, a 8 inch silicon wafer substrate having a polysilicon film formed by a CVD method, a 8 inch silicon wafer substrate having a silicon nitride film formed by a CVD method and a 8 inch silicon wafer substrate having a silicon dioxide film formed by a thermal oxidation method, were used.

As objects to be polished by polishing compounds in Examples 5 and 6, an 8 inch silicon wafer substrate having a polysilicon film formed by a CVD method and an 8 inch silicon wafer substrate having a silicon dioxide film formed by a thermal oxidation method were used.

(3) Method for Evaluating Properties of Polishing Compound

Measurement of polishing rate: Film thickness meter U-1280SE (manufactured by KLA-Tencor) was used.

Example 1

Cerium oxide abrasive particles and ammonium polyacrylate having a molecular weight of 5,000 as a dispersant were mixed in a mass ratio of 100:0.7 in deionized water with stirring, followed by ultrasonic dispersion and filtering to prepare a mixture having a concentration of abrasive particles of 10% and a dispersant concentration of 0.07%. This mixture was diluted five times with deionized water to prepare an abrasive particles mixture A having an abrasive particle concentration of 2% and a dispersant concentration of 0.014%. The pH of the abrasive particle mixture A was 7.6, and the average particle size was 0.19 μm.

Then, in deionized water, a polyoxypropylene diamine (tradename, polyetheramine, manufactured by BASF) having a molecular weight of 230 which is an amine type water-soluble polymer, as an additive, and ammonia, which is a basic compound, were dissolved to prepare an additive liquid B having a polyoxypropylene diamine concentration of 1.0% and an ammonia concentration of 0.01%.

The additive liquid B and the abrasive particle mixture A in a mass ratio of 1:1 were mixed with stirring to prepare a polishing compound having an abrasive particle concentration of 1%, an ammonium polyacrylate concentration of 0.007%, a polyoxypropylene diamine concentration of 0.5%, an ammonia concentration of 0.005% and a pH of 10.8.

The composition of the polishing compound, the pH, the average particle size and the coagulation sedimentation time of the polishing compound are shown in Table 1, and the results of evaluation of the polishing properties are shown in Table 2.

Example 2

An abrasive particle mixture A was prepared in the same manner as in Example 1, and an additive liquid C was prepared in the same manner as in the preparation of the additive liquid B in Example 1 except that the concentration of the polyoxypropylene diamine was 1.0% and the ammonia concentration was 0.68%. The additive liquid C and the abrasive particle mixture A in a mass ratio of 1:1 were mixed to prepare a polishing compound having an abrasive particle concentration of 1%, a concentration of the ammonium polyacrylate as a dispersant of 0.007%, a concentration of the polyoxypropylene diamine as an additive of 0.5%, an ammonia concentration of 0.34% and a pH of 11.5.

Evaluation of the polishing compound was conducted in the same manner as in Example 1. The composition of the polishing compound, the pH and the average particle size are shown in Table 1, and the results of evaluation of the polishing properties are shown in Table 2.

Example 3

An abrasive particle mixture A was prepared in the same manner as in Example 1, and an additive liquid D was prepared in the same manner as in the preparation of the additive liquid B in Example 1 except that the concentration of the polyoxypropylene diamine was 1.0% and the ammonia concentration was 1.7%. The additive liquid D and the abrasive particle mixture A in a mass ratio of 1:1 were mixed to prepare a polishing compound having an abrasive particle concentration of 1%, a concentration of the ammonium polyacrylate as a dispersant of 0.007%, a concentration of the polyoxypropylene diamine as an additive of 0.5%, an ammonia concentration of 0.85% and a pH of 11.7.

Evaluation of the polishing compound was conducted in the same manner as in Example 1. The composition of the polishing compound, the pH and the average particle size are shown in Table 1, and the results of evaluation of the polishing properties are shown in Table 2.

Example 4

An abrasive particle mixture A was prepared in the same manner as in Example 1, and an additive liquid E was prepared in the same manner as in the preparation of the additive liquid B in Example 1 except that the polyoxypropylene diamine concentration was 1.0%, and that potassium hydroxide was used at a concentration of 0.02% as the basic compound instead of ammonia. The additive liquid E and the abrasive particle mixture A in a mass ratio of 1:1 were mixed to prepare a polishing compound having an abrasive particle concentration of 1%, a concentration of the ammonium polyacrylate as a dispersant of 0.007%, a concentration of the polyoxypropylene diamine as an additive of 0.5%, a potassium hydroxide concentration of 0.01% and a pH of 11.5.

Evaluation of the polishing compound was conducted in the same manner as in Example 1. The composition of the polishing compound, the pH and the average particle size are shown in Table 1, and the results of evaluation of the polishing properties are shown in Table 2.

Example 5

An abrasive particle mixture A was prepared in the same manner as in Example 1, and an additive liquid F was prepared in the same manner as in the preparation of the additive liquid B in Example 1 except that the polyoxypropylene diamine concentration was 0.2%, and that monoethanolamine was used at a concentration of 0.4% as the basic compound instead of ammonia. The additive liquid F and the abrasive particle mixture A in a mass ratio of 1:1 were mixed to prepare a polishing compound having an abrasive particle concentration of 1%, a concentration of the ammonium polyacrylate as a dispersant of 0.007%, a concentration of the polyoxypropylene diamine as an additive of 0.1%, a monoethanolamine concentration of 0.2% and a pH of 11.1.

Evaluation of the polishing compound was conducted in the same manner as in Example 1. The composition of the polishing compound, the pH and the average particle size are shown in Table 1, and the results of evaluation of the polishing properties are shown in Table 2.

Example 6

An abrasive particle mixture A was prepared in the same manner as in Example 1, and an additive liquid G was prepared in the same manner as in the preparation of the additive liquid B in Example 1 except that the polyoxypropylene diamine concentration was 0.2%, and that tetramethylammonium hydroxide was used at a concentration of 0.24% as the basic compound instead of ammonia. The additive liquid G and the abrasive particle mixture A in a mass ratio of 1:1 were mixed to prepare a polishing compound having an abrasive particle concentration of 1%, a concentration of the ammonium polyacrylate as a dispersant of 0.007%, a concentration of the polyoxypropylene diamine as an additive of 0.1%, a tetramethylammonium hydroxide concentration of 0.12% and a pH of 12.3.

Evaluation of the polishing compound was conducted in the same manner as in Example 1. The composition of the polishing compound, the pH and the average particle size are shown in Table 1, and the results of evaluation of the polishing properties are shown in Table 2.

Example 7

As a Comparative Example, SS25 manufactured by Cabot Corporation containing fumed silica, water and potassium hydroxide was used. The results of evaluation of the polishing properties are shown in Table 2.

Example 8

As a Comparative Example, Planerite 6103 manufactured by FUJIMI INCORPORATED containing colloidal silica, water and a basic organic compound was used. The results of evaluation of the polishing properties are shown in Table 2.

The polishing compounds prepared by the methods in Examples 1 to 6 had an average particle size of 0.19 μm which is the same as that of the abrasive particle mixture A. That is, coagulation of the abrasive particles did not proceed by mixing with the additive liquids B to G. These polishing compounds were left at rest to evaluate dispersion stability, whereupon the dispersed state was maintained over one week or longer. The dispersed state is the same level as that of the abrasive particle mixture A to which no additive was added, and such indicates excellent dispersibility.

TABLE 2

| Ex. | Vps (nm/min) | Vso (nm/min) | Vsn (nm/min) | Vps:Vso:Vsn |
|---|---|---|---|---|
| 1 | 213 | 14 | 4 | 1:0.06:0.02 |
| 2 | 237 | 95 | 8 | 1:0.40:0.03 |
| 3 | 282 | 319 | 10 | 1:1.13:0.04 |
| 4 | 217 | 126 | 9 | 1:0.58:0.04 |
| 5 | 290 | 170 | — | 1:0.59 |
| 6 | 180 | 74 | — | 1:0.41 |
| 7 | 450 | 253 | 53 | 1:0.56:0.12 |
| 8 | 476 | 33 | 22 | 1:0.07:0.05 |

Figure 3:
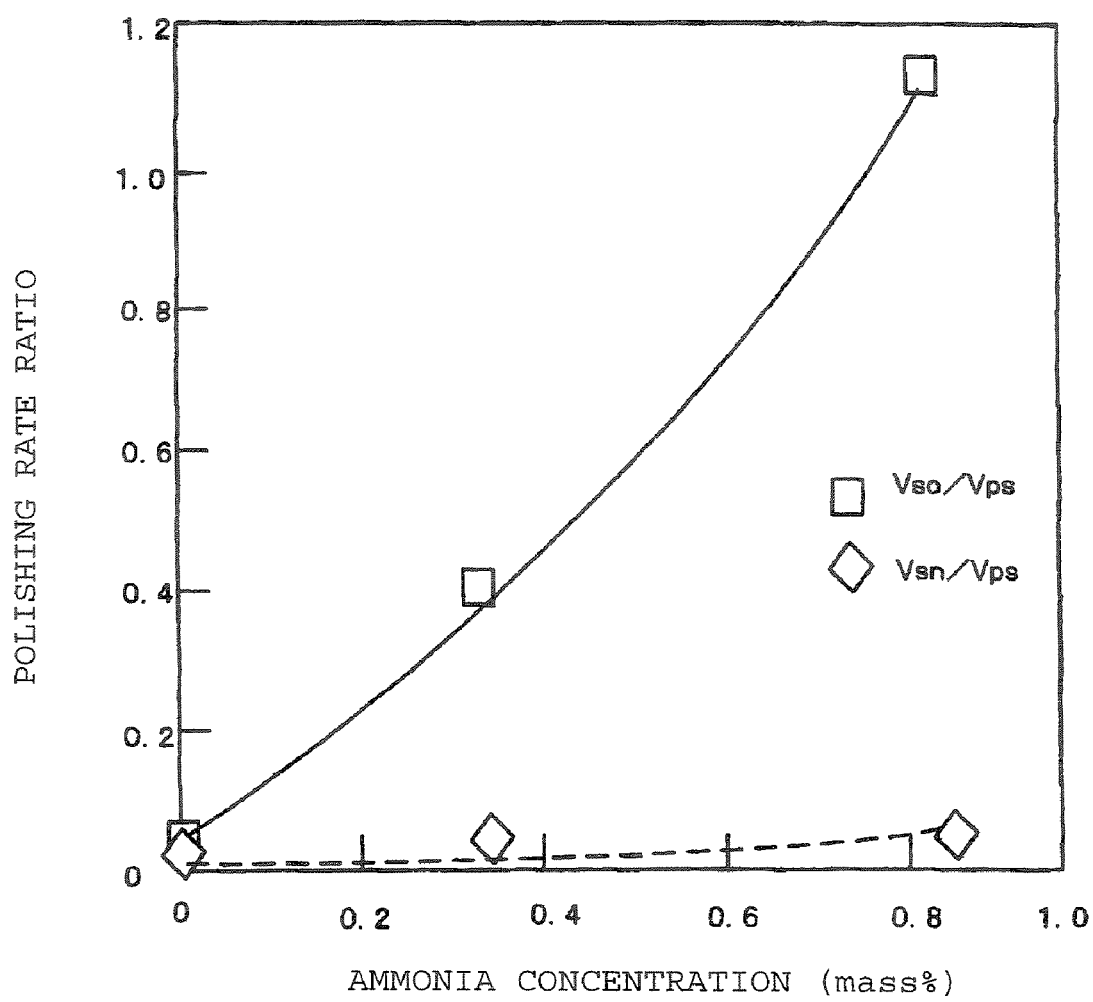
FIG. 3 is a graph illustrating the correlation of the ammonia concentration in the polishing compound with Vso/Vps and Vsn/Vps in Examples 1 to 3 of the present invention.

Regarding the polishing properties, in Example 1 which is an Example of the present invention, as compared with Example 7 which is a Comparative Example, the polishing rates of the silicon dioxide film and the silicon nitride film are low, and the polishing rates of the polysilicon film is high as compared with the above polishing rates, that is, the polishing rate ratios of the polysilicon film to the others, Vps/Vso and Vps/Vsn, are high. Further, as compared with Example 8 which is a Comparative Example, Vps/Vso is substantially the same, but Vps/Vsn is at least double. Further, in Comparative Examples 7 and 8, the polishing rate of the silicon dioxide film can not be controlled, whereas in Examples 1 to 6, the polishing rate of the silicon dioxide film can be controlled within a wide range. Particularly in Examples 1 to 3, it is understood that the polishing rate of the silicon dioxide film can be controlled while maintaining the polishing rate ratio of the polysilicon film to the silicon nitride film, by adjusting the ammonia concentration as a basic compound. This is clearly shown in FIG. 3 illustrating the correlation of the ammonia concentration with Vso/Vps and Vsn/vps in Examples 1 to 3 of the present invention.

As described above, the polishing compound of the present invention is suitable for a case where in planarization of a plane to be polished including a polysilicon film, a silicon dioxide film or a silicon nitride film is used as a stopper layer which is an underlayer of the polysilicon film. Further, it can realize planarization of unevenness on a plane to be polished at a high level by controlling the polishing rate of the silicon

TABLE 1

| Ex. | Cerium oxide particle size (μm) | Concentration of dispersant (%) | Concentration of additive (polyoxypropylene diamine) (%) | Basic compound Type | Basic compound Concentration (%) | pH | Coagulation sedimentation time |
|---|---|---|---|---|---|---|---|
| 1 | 0.19 | 0.007 | 0.5 | Ammonia | 0.005 | 10.8 | Longer than one week |
| 2 | 0.19 | 0.007 | 0.5 | Ammonia | 0.34 | 11.5 | Longer than one week |
| 3 | 0.19 | 0.007 | 0.5 | Ammonia | 0.85 | 11.7 | Longer than one week |
| 4 | 0.19 | 0.007 | 0.5 | Potassium hydroxide | 0.01 | 11.5 | Longer than one week |
| 5 | 0.19 | 0.007 | 0.1 | Monoethanolamine | 0.20 | 11.1 | Longer than one week |
| 6 | 0.19 | 0.007 | 0.1 | Tetramethylammonium hydroxide | 0.12 | 12.3 | Longer than one week | dioxide film within a wide range while maintaining a high polishing rate ratio of the polysilicon film to the silicon nitride film. Further, the present polishing compound is excellent in dispersion stability without coagulation of abrasive particles and is advantageous against polishing defects.

INDUSTRIAL APPLICABILITY

The polishing compound of the present invention is excellent in properties to planarize a plane to be polished including a polysilicon film and in dispersion stability, and provides few polishing defects. Thus, it is suitably applied to production of a semiconductor device, particularly to planarization of a plane to be polished including a polysilicon film to be used for a capacitor, a gate electrode, etc. in formation of multilayered wiring, planarization of an interlevel dielectric film relating to a polysilicon film, and planarization of an insulating film for shallow trench isolation.

The entire disclosure of Japanese Patent Application No. 2005-074373 filed on Mar. 16, 2005 including specification, claims, drawings and summary is incorporated herein by reference in its entirety.

What is claimed is:

1. A polishing composition comprising
cerium oxide particles,
a water-soluble polyether diamine represented by the following formula (2),
at least one basic compound selected from the group consisting of sodium hydroxide, potassium hydroxide, lithium hydroxide, tetramethylammonium hydroxide, monoethanolamine, ethylethanolamine, diethanolamine, propylenediamine, ammonia;
and water,
wherein
the composition has a pH ranging from 10 to 13:

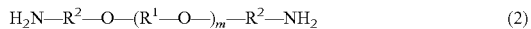

$$H_2N-R^2-O-(R^1-O-)_m-R^2-NH_2 \quad (2)$$

wherein $R^1$ is an ethylene group or a propylene group, $R^2$ is a $C_{2-6}$ alkylene group, m is an integer of at least 1, and n is an integer of at least 1, provided that $R^1$ and $R^2$ may be the same or different.

2. The composition according to claim 1, wherein the basic compound is ammonia.

3. The composition according to claim 1, which comprises the basic compound in an amount of from 0.001 to 5.0 mass % in the composition.

4. The composition according to claim 1, wherein the water-soluble polyether diamine has a weight average molecular weight of from 100 to 100,000.

5. The composition according to claim 1, which comprises the water-soluble polyether diamine in an amount of from 0.001 to 20 mass % based on the total mass of the composition.

6. A method for polishing a plane to be polished, comprising
supplying a polishing composition to a polishing pad, and
bringing a plane to be polished of a semiconductor integrated circuit device and the polishing pad comprising the polishing composition into contact with each other to polish the plane to be polished by relative movement between them;
wherein
the plane to be polished comprises a plane to be polished of a polysilicon film, and
the composition as defined in claim 1 is used as the polishing composition.

7. A method for producing a semiconductor integrated circuit device, which comprises polishing a plane to be polished by the polishing method as defined in claim 6.

8. The composition of claim 1, wherein the basic compound is potassium hydroxide.

9. The composition of claim 1, wherein the basic compound is monoethanolamine.

10. The composition of claim 1, wherein the basic compound is tetramethylammonium hydroxide.

11. The composition of claim 1, wherein the average particle diameter of the cerium oxide particles ranges from 0.01 to 0.5 μm.

12. The composition of claim 1, wherein the water-soluble polyether diamine has a weight average molecular weight of from 150 to 800.

13. The composition of claim 12, wherein the water-soluble polyether diamine has a weight average molecular weight of from 150 to 400.

14. The composition of claim 1, further comprising a dispersant.

15. The composition of claim 14, wherein the dispersant is an ammonium polyacrylate.

16. The composition of claim 11, wherein the average particle diameter of the cerium oxide particles ranges from 0.05 to 0.2 μm.

17. The composition of claim 1, wherein the polyether diamine is a polyoxypropylene diamine.

18. The composition of claim 1, wherein the polyether diamine is a polyoxyethylene diamine.

19. The composition of claim 1, wherein the polyether diamine is a 4,7,10-trioxa-tridecane-1,13-diamine.

20. A method for polishing a plane of a semiconductor integrated circuit device comprising a polysilicon film, a silicon dioxide film and a silicon nitride film, which method comprises polishing said plane with a composition comprising:
cerium oxide particles,
a water-soluble polyamine, and
water,
wherein the composition has a pH ranging from 10 to 13, and
wherein the polishing rate of the polysilicon film (Vps), the polishing rate of the silicon dioxide film (Vso) and the polishing rate of the silicon nitride film (Vsn) are controlled such that a ratio of Vps/Vso is from 0.5 to 1.5, and Vps/Vsn is at least double that of Vps/Vso.

21. The composition of claim 1, wherein the water-soluble polyether diamine is at least one polyamine selected from the group consisting of a polyoxypropylene diamine, polyoxyethylene diamine and 4,7,10-trioxa-tridecane-1,13-diamine.

\* \* \* \* \*